(12) United States Patent
Huang et al.

(10) Patent No.: US 11,291,127 B2
(45) Date of Patent: Mar. 29, 2022

(54) HAND CONTROLLER

(71) Applicant: Ningbo Wistopht Technology Co., Ltd, Ningbo (CN)

(72) Inventors: Jiayin Huang, Ningbo (CN); Hongbin Lu, Ningbo (CN); Jinyi Li, Ningbo (CN); Enjie Ruan, Ningbo (CN); Xingliang Chen, Ningbo (CN)

(73) Assignee: NINGBO WISTOPHT TECHNOLOGY CO., LTD, Ningbo (CN)

( * ) Notice: Subject to any disclaimer, the term of this patent is extended or adjusted under 35 U.S.C. 154(b) by 173 days.

(21) Appl. No.: 16/880,229

(22) Filed: May 21, 2020

(65) Prior Publication Data

US 2021/0212220 A1 Jul. 8, 2021

(30) Foreign Application Priority Data

Jan. 6, 2020 (CN) .......................... 202010011145.7

(51) Int. Cl.
*G05G 1/02* (2006.01)
*H05K 5/00* (2006.01)
*H05K 5/02* (2006.01)
*H05K 5/03* (2006.01)
*A47B 9/00* (2006.01)
*A47B 13/00* (2006.01)

(52) U.S. Cl.
CPC ............ *H05K 5/0017* (2013.01); *G05G 1/02* (2013.01); *H05K 5/0013* (2013.01); *H05K 5/0278* (2013.01); *H05K 5/03* (2013.01); *A47B 9/00* (2013.01); *A47B 13/00* (2013.01)

(58) Field of Classification Search
None
See application file for complete search history.

(56) References Cited

U.S. PATENT DOCUMENTS

| 2007/0051608 | A1* | 3/2007 | Pedersen | H01H 36/004 |
| | | | | 200/341 |
| 2016/0256231 | A1* | 9/2016 | Ogawa | G05G 1/02 |
| 2017/0356223 | A1* | 12/2017 | Do | E05B 41/00 |
| 2019/0041892 | A1* | 2/2019 | Wada | G05G 25/00 |

FOREIGN PATENT DOCUMENTS

| CN | 205903008 U | 1/2017 |
| CN | 209149983 U | 7/2019 |

\* cited by examiner

*Primary Examiner* — Xanthia C Cunningham
(74) *Attorney, Agent, or Firm* — Innovation Capital Law Group, LLP; Vic Lin

(57) ABSTRACT

A hand controller has a housing, the housing provided with a plurality of convex keys, wherein the housing has an outside wall provided with a first engagement portion; a cover plate, being in a snap connection with the housing; and a connection assembly, the connection assembly provided with a second engagement portion which is in an engagement connection with the first engagement portion, wherein the engagement between the first engagement portion and the second engagement portion drives the connection assembly to move up and down along the thickness direction of the housing, and the connection assembly is provided with a connection portion, wherein the connection portion is connected with the installation position of the hand controller via a fastener. The hand controller can apply to mounting desks of different thicknesses and improve the universality of the hand controller.

20 Claims, 19 Drawing Sheets

B-B

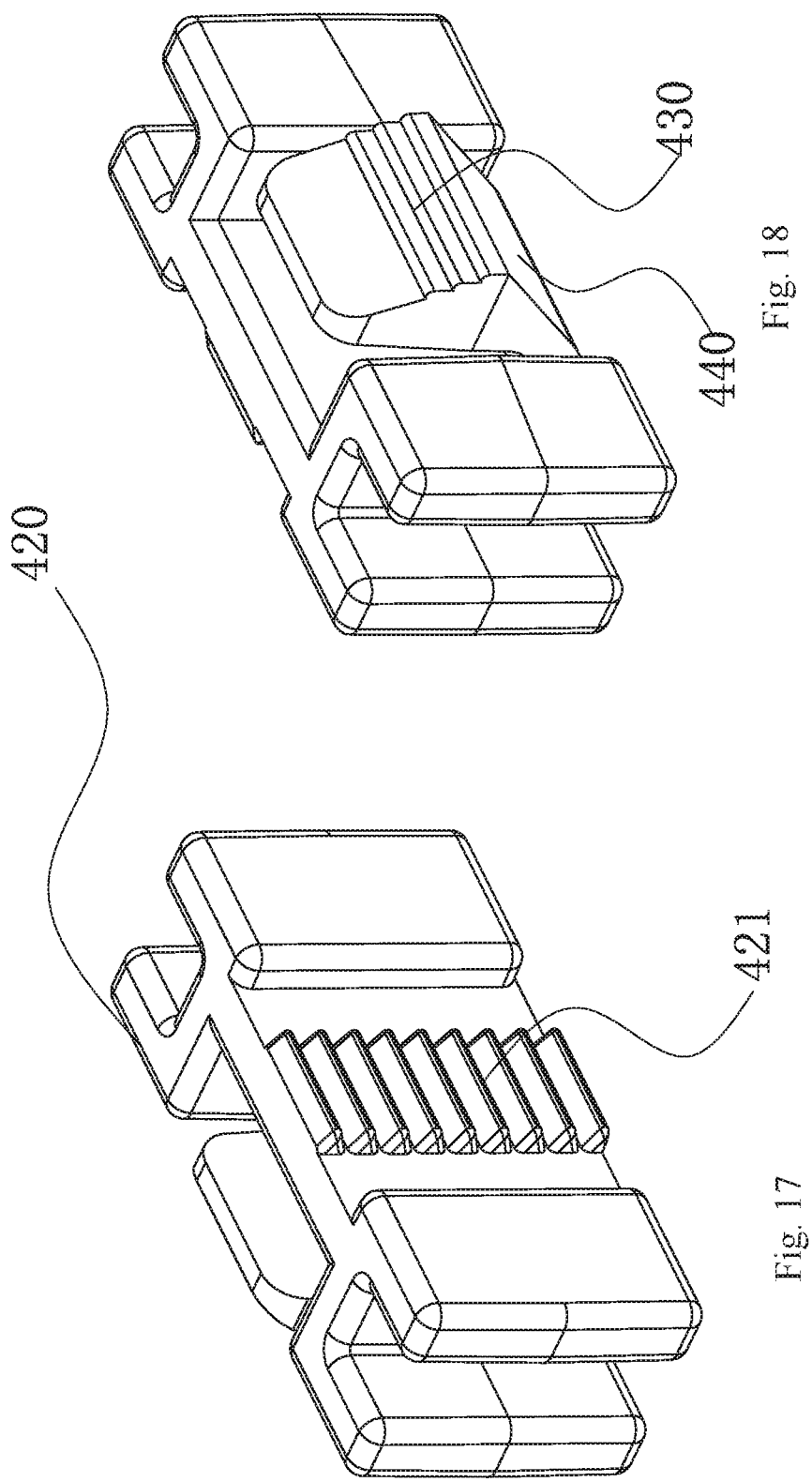

HAND CONTROLLER

BACKGROUND OF THE INVENTION

1. Technical Field

The present invention relates to the field of electric control accessories and it particularly relates to a hand controller.

2. Description of Related Art

Furniture with a tabletop such as office desks, computer desks, dining tables and tatami mats are all fixed structures. To meet demands on different heights, such furniture can be installed with a lifting device to change the height of the tabletop. Existing lifting tables and lifting devices are all electrically, pneumatically or manually structured. An electrical lifting table or each of its legs is generally equipped with a motor, a control box and a hand controller. The traditional hand controller is generally directly installed at the bottom of the tabletop or embedded in the tabletop via connection parts, while the connection parts are all fixedly connected with the housing of the hand controller. Therefore, the hand controller is fixed at a height when installed at external equipment. Tabletops vary with thickness, such that the hand controller cannot be installed or the keys fail to reach a proper height after the hand controller is installed, which affects the use of the hand controller.

BRIEF SUMMARY OF THE INVENTION

(I) Technical Problems to be Solved

The present invention provides a hand controller of which the connection parts are adjustable in height to solve the problems of failure to install the hand controller or install the hand controller in place due to variance of tabletop thicknesses in prior art.

(II) Technical Scheme

In order to solve the above problems, the present invention provides a hand controller, including:

a housing, the housing being provided with a plurality of convex keys, wherein the housing has an outside wall provided with a first engagement portion;

a cover plate, being in a snap connection with the housing; and, a connection assembly, the connection assembly provided with a second engagement portion which is in an engagement connection with the first engagement portion, wherein the engagement between the first engagement portion and the second engagement portion drives the connection assembly to move up and down along the thickness direction of the housing, and the connection assembly is provided with a connection portion, wherein the connection portion is connected to the installation position of the hand controller via a fastener.

In the hand controller, the first engagement portion includes at least one limiting part arranged on the housing, wherein the limiting part is provided with first teeth; the connection assembly includes at least one connection part, and the connection part is provided with the second engagement portion, wherein the second engagement portion comprises second teeth which are engaged with the first teeth.

In the hand controller, a first guide portion for guiding the connection assembly to move up and down along the thickness direction of the housing is arranged between each connection part and the housing, wherein the first guide portion is adapted to male-female fit connection.

In the hand controller, the first guide portion includes a guide wall which is arranged on one or two sides of the limiting part, and a guide slot which is arranged on corresponding one or two sides of the connection part.

In the hand controller, the second guide portion includes a pusher mounted on the cover plate or a push hole formed on the cover plate.

In the hand controller, the bevel-guided movable structure includes a first guide bevel, and the first guide bevel is arranged on one side of the pusher or the limiting part.

In the hand controller, the bevel-guided movable structure includes a first guide bevel, and the first guide bevel is arranged on one side of the pusher, the push hole or the limiting part.

In the hand controller, a third guide portion is arranged between each limiting part and the cover plate, wherein the third guide portion consists of two guide blocks which are respectively located on two sides of the second guide portion, and the guide blocks are mounted on the cover plate.

In the hand controller, each of the guide blocks is provided with a second guide bevel.

In the hand controller, the connection part is a Z-shaped structure, wherein the second engagement portion and the connection portion are respectively arranged at two ends of the connection part, and the connection portion is a threaded hole formed on the connection part.

In the hand controller, a clamping groove is arranged at each of corners of the housing, and an elastic buckle is arranged at each of corresponding corners of the cover plate.

The present invention provides a hand controller, including:

a housing, the housing provided with a control panel, wherein the housing has an outside wall provided with a first engagement portion;

a cover plate, being in a snap connection with the housing; and, a connection assembly, the connection assembly provided with a second engagement portion which is in an engagement connection with the first engagement portion, wherein the engagement between the first engagement portion and the second engagement portion drives the connection assembly to move up and down along the thickness direction of the housing, and the connection assembly is provided with a connection portion, wherein the connection portion is leaned against and clamped with the installation position of the hand controller.

In the hand controller, the connection portion is provided with a step-like bevel.

In the hand controller, the connection portion is also provided with a third guide bevel, wherein the step-like bevel and the third guide bevel form a horn distribution.

The present invention provides a hand controller, including:

a housing, the housing being provided with a plurality of convex keys, wherein the housing has an outside wall provided with a first engagement portion;

a cover plate, being in a snap connection with the housing;

a connection assembly, the connection assembly provided with a second engagement portion which is in an engagement connection with the first engagement portion, wherein the engagement between the first engagement portion and the second engagement portion drives the connection assembly to move up and down along the thickness direction of the housing, and the connection assembly is provided with a connection portion, wherein the connection portion is connected to the installation position of the hand controller via a fastener; and, a USB module, detachably connected to one side of the housing.

The present invention provides a hand controller, including:

a housing, the housing provided with a control panel, wherein the housing has an outside wall provided with a first engagement portion;

a cover plate, being in a snap connection with the housing; and, a connection assembly, the connection assembling provided with a second engagement portion which is in an engagement connection with the first engagement portion, wherein the engagement between the first engagement portion and the second engagement portion drives the connection assembly to move up and down along the thickness direction of the housing, and the connection assembly is provided with a connection portion, wherein the connection portion is leaned against and clamped with the installation position of the hand controller; and, a USB module, detachably connected to one side of the housing.

In the hand controller, a fourth guide portion is arranged between the USB module and the housing, wherein the fourth guide portion is adapted to male-female fit connection.

In the hand controller, the fourth guide portion includes a sliding slot which is arranged on the housing, and a sliding bar which is arranged on USB module.

In the hand controller, the fourth guide portion also includes a locating groove which is arranged on the cover plate and a locating block which is arranged at an end of the sliding bar.

In the hand controller, the locating groove and the locating block are both structured as dovetails or circular arcs.

(III) Beneficial Effects (1) The present invention provides a hand controller which drives the connection assembly to move up and down along the thickness direction of the housing through the engagement between the connection assembly and the housing to change the height of the connection portion on the connection assembly relative to the keys, thus realizing that the hand controller applies to mounting desks of different thicknesses and improving the universality of the hand controller.

(2) The arrangement of the limiting part and the corresponding connection part allows easy adjustment on all corners of the hand controller, and ensures the stability when the hand controller is installed on the tabletop and the reliability of signal transmission when a user presses the keys.

(3) The first guide portion which guides the connection part to move up and down along the limiting part is arranged, such that the user can smoothly and conveniently adjust the height of the connection part.

(4) The guide bevels are arranged to be matched with the sliding second guide portion such that an "outwards projecting" force is applied to the "inwards concave" limiting part by the principle of sliding on the bevel to move the limiting part towards the connection part when the housing is connected with the cover plate, thus locking the limiting part and the connection part to lock the height of the connection part and avoid the limiting part from rebounding after the housing is connected with the cover plate, so as t ensure reliable locking between the limiting part and the connection part.

(5) The third guide part is used to adjust the left and right positions of the limiting part and limit the degree of freedom of the limiting part in the horizontal direction, thus ensuring further reliable locking between the limiting part and the connection part.

(6) The arrangement of the USB module adds a function to the hand controller, and provides one more option for users, making the product more user-friendly.

(7) The locating groove and the locating blocks are structured as dovetails or circular arcs to limit the degree of freedom of the USB module on the cover plate and avoid the USB module from moving horizontally, so as to improve the electrification reliability of the USB module.

(8) The step-like connection portion realizes fixation between the hand controller and the tabletop, so the operation is more convenient and reliable; in addition, the step-like bevel of the connection portion can further improve locking between the connection part and the limiting part to improve the operation reliability of the hand controller.

(9) The third guide bevel facilitates the embedded installation of the hand controller in the tabletop, and the step-like bevel realizes the reliable connection between the hand controller and the tabletop.

BRIEF DESCRIPTION OF THE SEVERAL VIEWS OF THE DRAWINGS

FIG. 17 is a structural view of the connection part in the hand controller in FIG. 13.

FIG. 18 is a structural view of the connection part in the hand controller in FIG. 13 from another angle of view.

Figure 1:
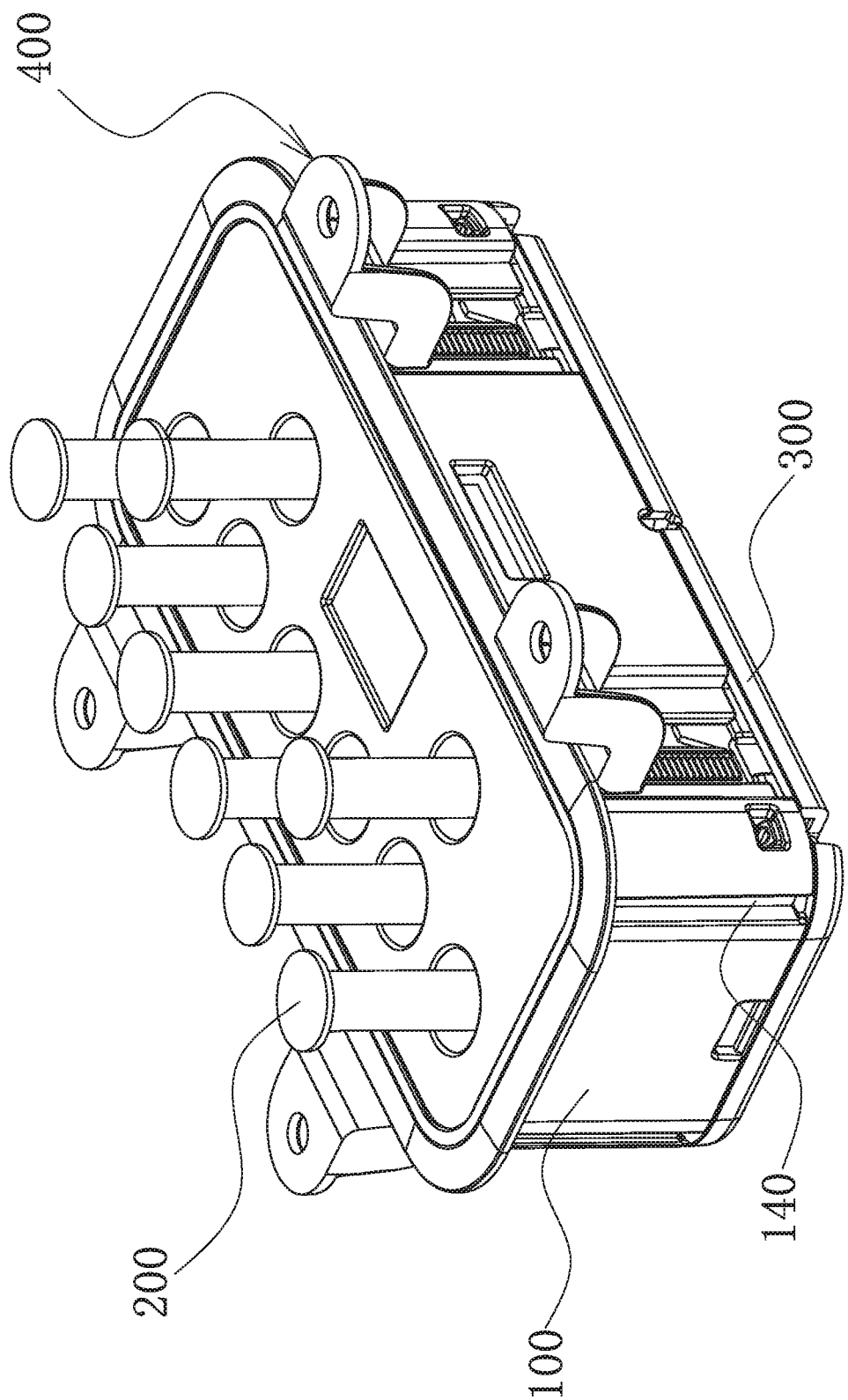
FIG. 1 is a structural view of a hand controller of the present invention.
Figure 2:
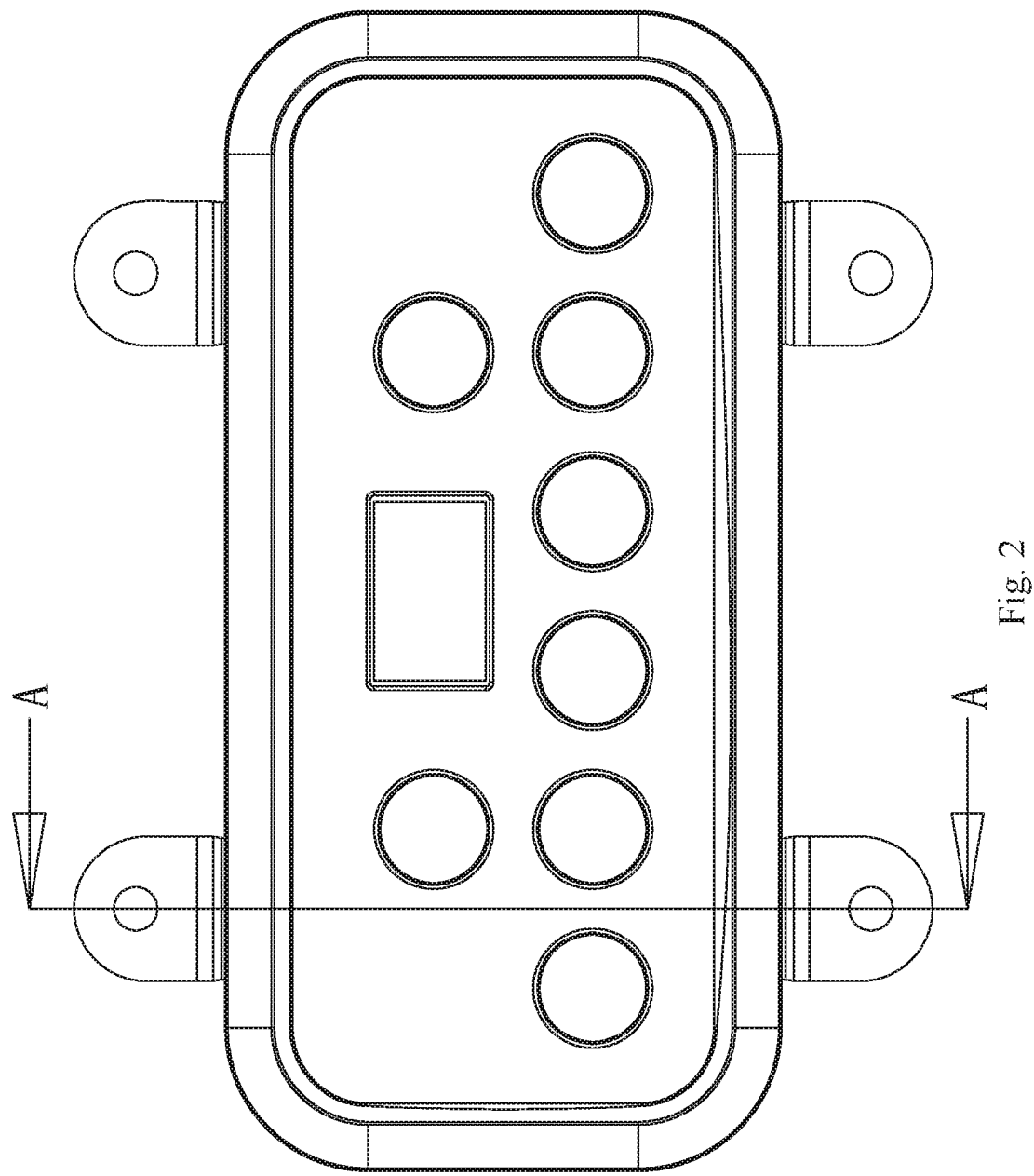
FIG. 2 is a structural view of the hand controller of the present invention as shown in FIG. 1 from another angle of view.
Figure 3:
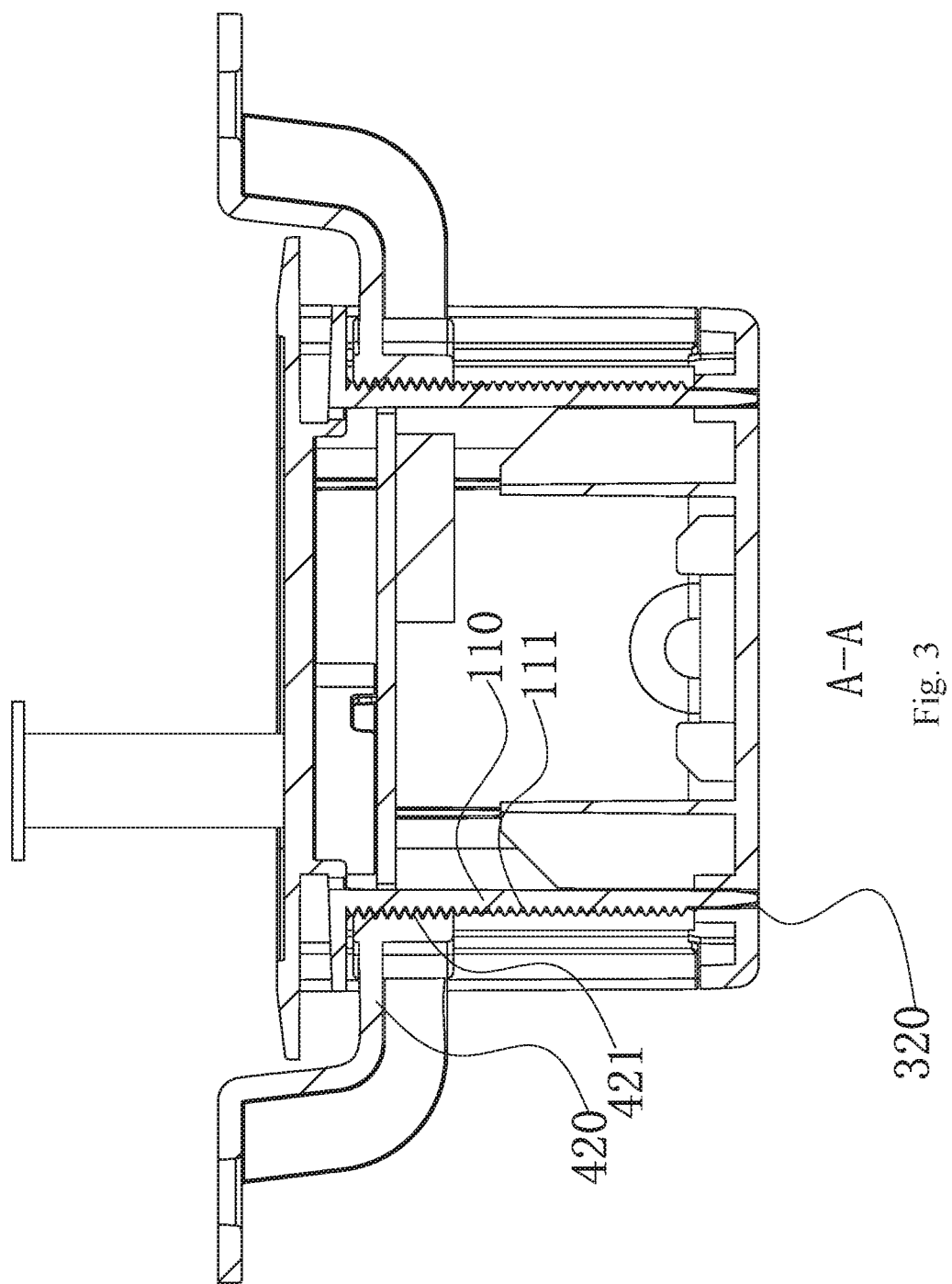
FIG. 3 is a sectional view of section A-A in FIG. 2.

In the drawings, 100—housing; 110—limiting part; 111—first teeth; 120—guide wall; 130—clamping groove; 140—sliding slot; 200—key; 300—cover plate; 310—pusher; 311—first guide bevel; 312—vertical plane; 320—push hole; 330—guide block; 331—second guide bevel; 340—elastic buckle; 350—locating groove; 400—connection assembly; 410—threaded hole; 420—connection part; 421—second teeth; 422—guide slot; 430—step-like bevel; 440—third guide bevel; 500—USB module; 510—sliding bar; 520—locating bock; 600—control panel.

DETAILED DESCRIPTION OF THE INVENTION

The present invention is further detailed in detail in conjunction with the attached drawings and embodiments. The following embodiments are intended for describing the present invention instead of limiting the scope of the present invention.

Embodiment 1

As shown in FIG. 1-9, the present invention provides a hand controller, including a housing 100, the housing provided with a plurality of convex keys 200, wherein the housing 100 has an outside wall provided with a first engagement portion; a cover plate 300, being in a snap connection with the housing 100; and a connection assembly 400, the connection assembly provided with a second engagement portion which is in an engagement connection with the first engagement portion, wherein the engagement between the first engagement portion and the second engagement portion drives the connection assembly 400 to move up and down along the thickness direction of the housing 100, and the connection assembly 400 is provided with a connection portion, wherein the connection portion is connected with the installation position of the hand controller via a fastener.

According to the hand controller provided by the present invention, the engagement between connection assembly and the housing drives the up-down movement of the connection assembly 400 along the thickness direction of the housing 100 to change the height of the connection portion on the connection assembly 400 relative to the keys 200, thus realizing that the hand controller applies to mounting desks of different thicknesses and improving the universality of the hand controller.

Further preferably, the first engagement portion includes at least one limiting part 110 arranged on the housing 100, wherein the limiting part 110 is provided with first teeth 111; the connection assembly 400 includes at least one connection part 420, and the connection part is provided with the second engagement portion, wherein the second engagement portion includes second teeth 421 which are engaged with the first teeth 111.

Figure 4:
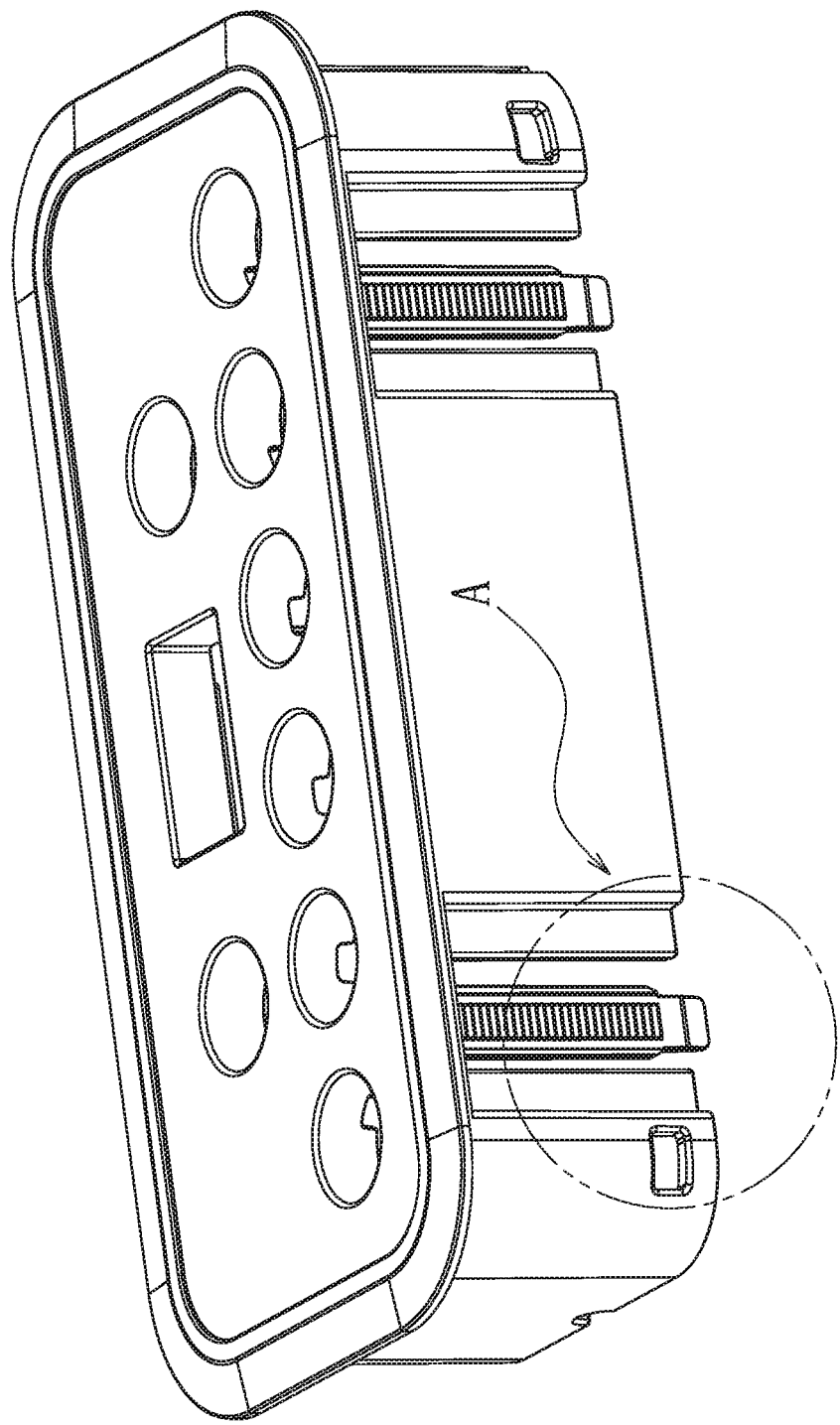
FIG. 4 is a structural view of a housing in a preferable embodiment of the present invention.
Figure 5:
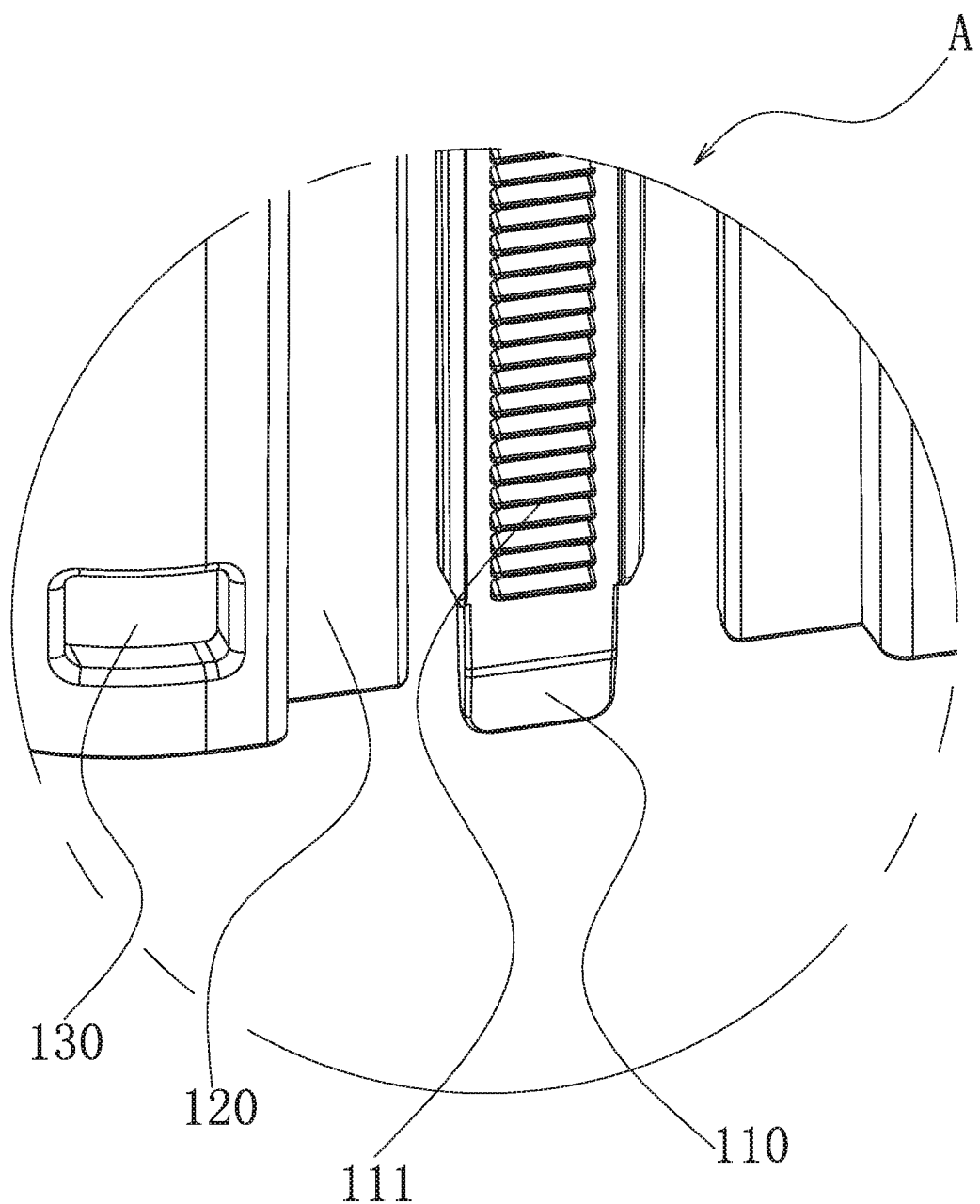
FIG. 5 is an enlargement view of part A in FIG. 4.
Figure 6:
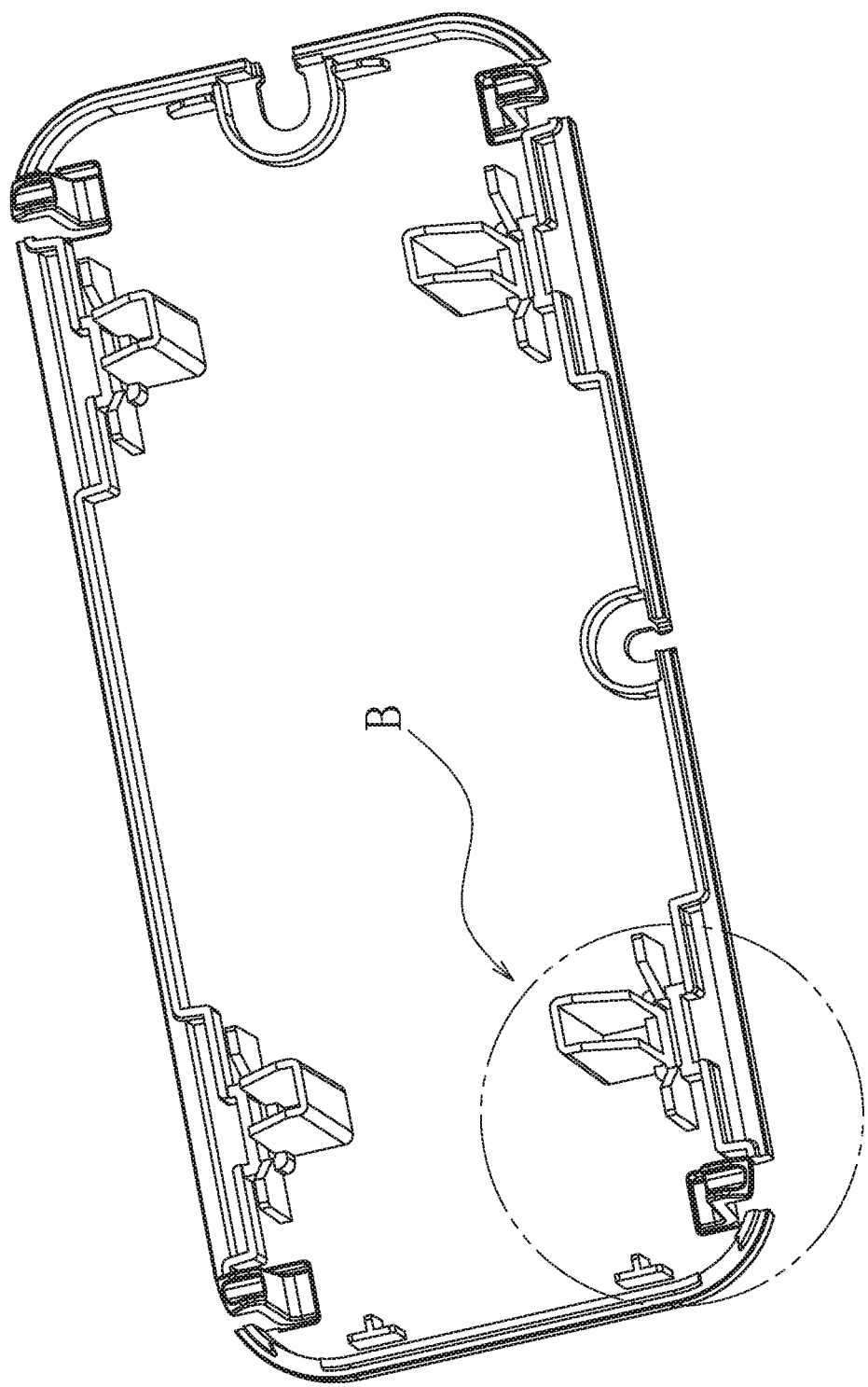
FIG. 6 is a structural view of a cover plate in a preferable embodiment of the present invention.
Figure 7:
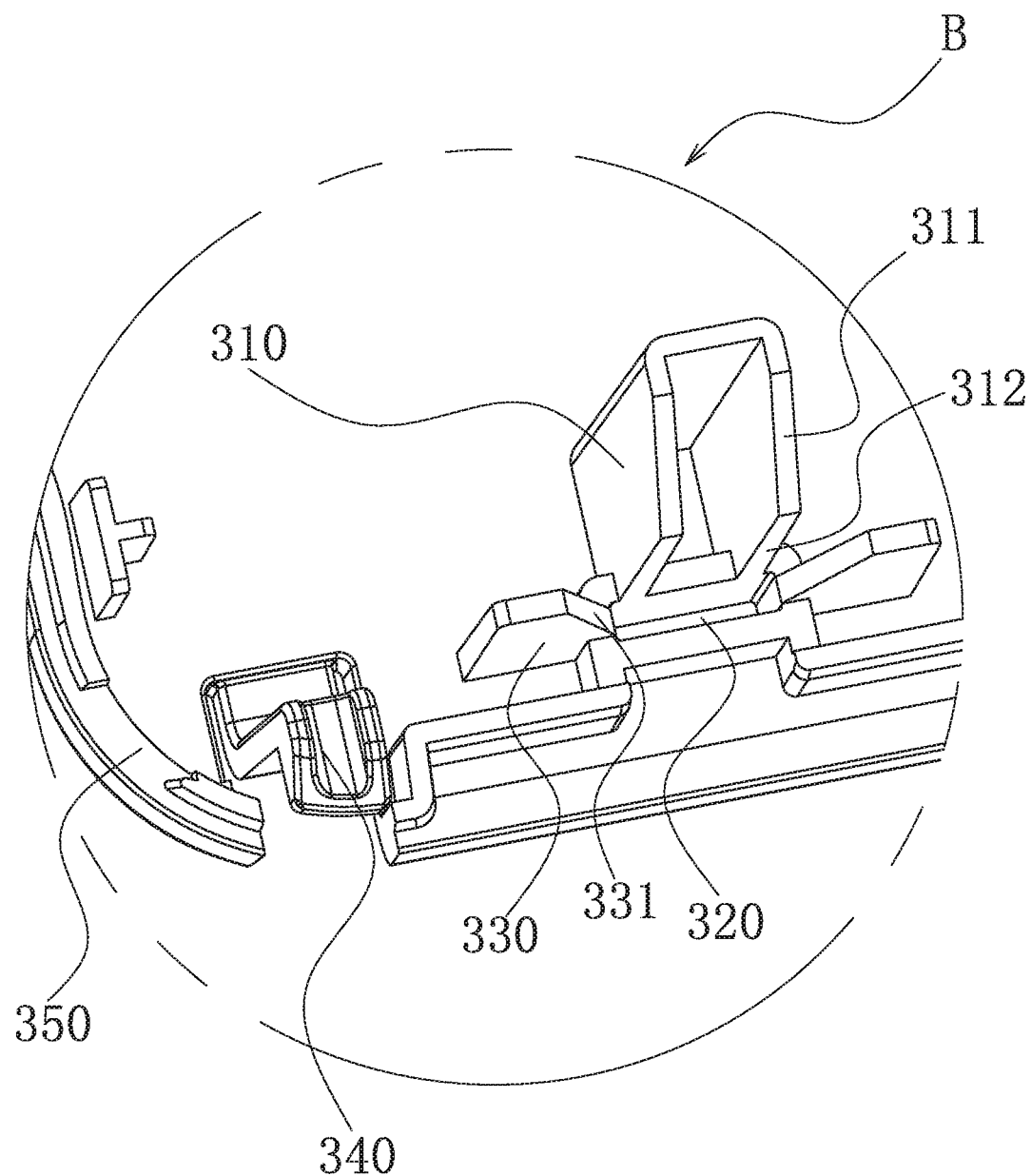
FIG. 7 is an enlargement of part B in FIG. 6.
Figure 8:
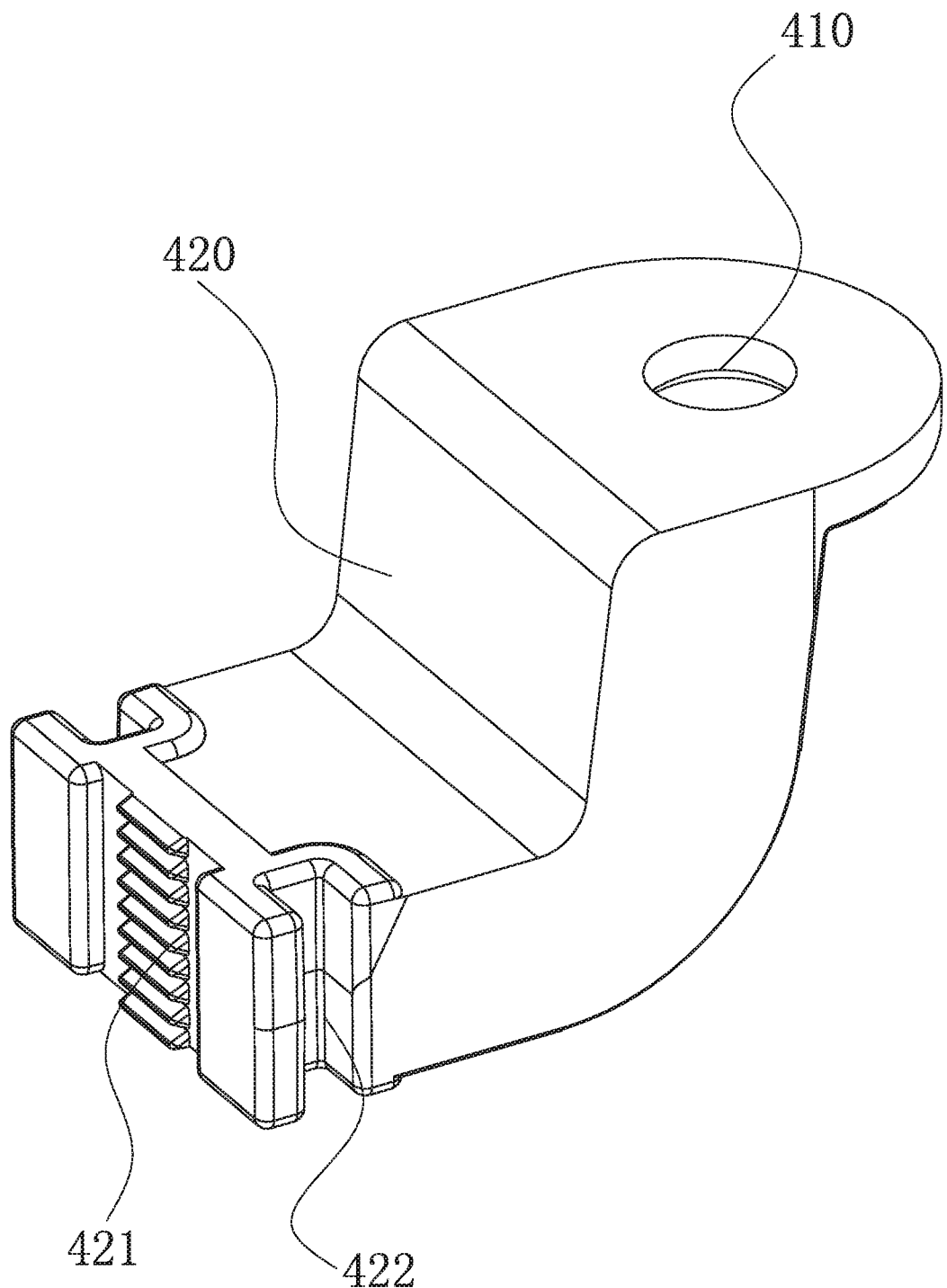
FIG. 8 is a structural view of a connection part in a preferable embodiment of the present invention.
Figure 9:
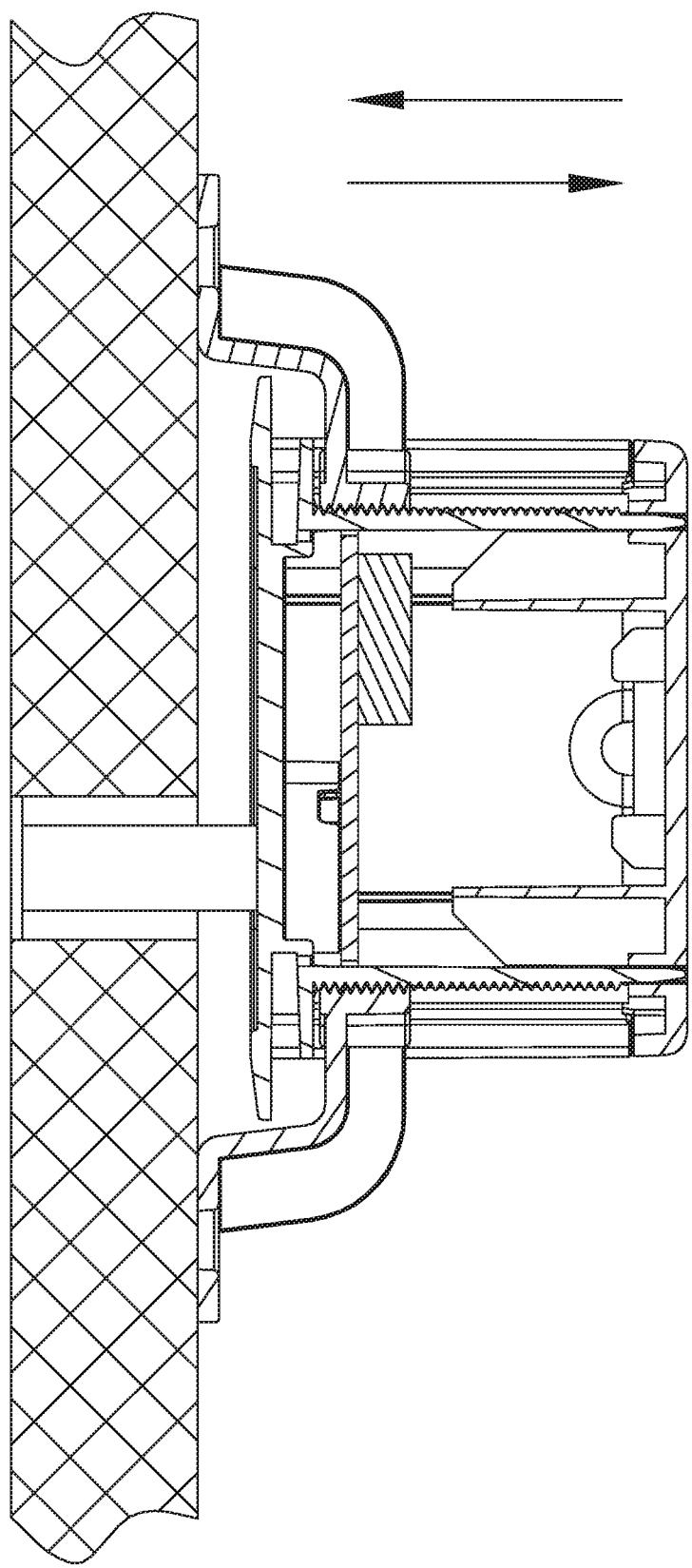
FIG. 9 is a sectional view of a hand controller in use of the present invention.
Figure 10:
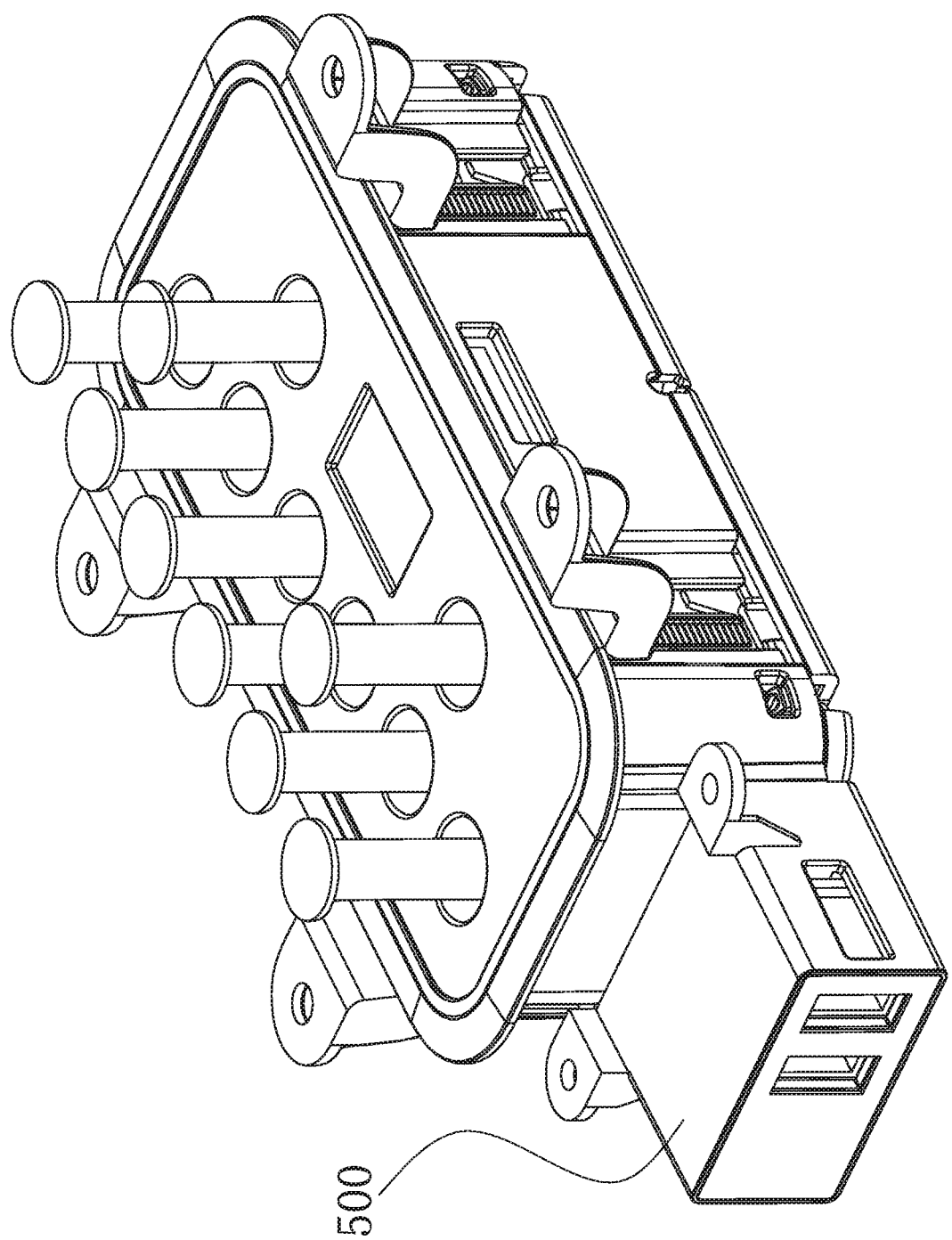
FIG. 10 is a structural view of a hand controller in another embodiment of the present invention.
Figure 11:
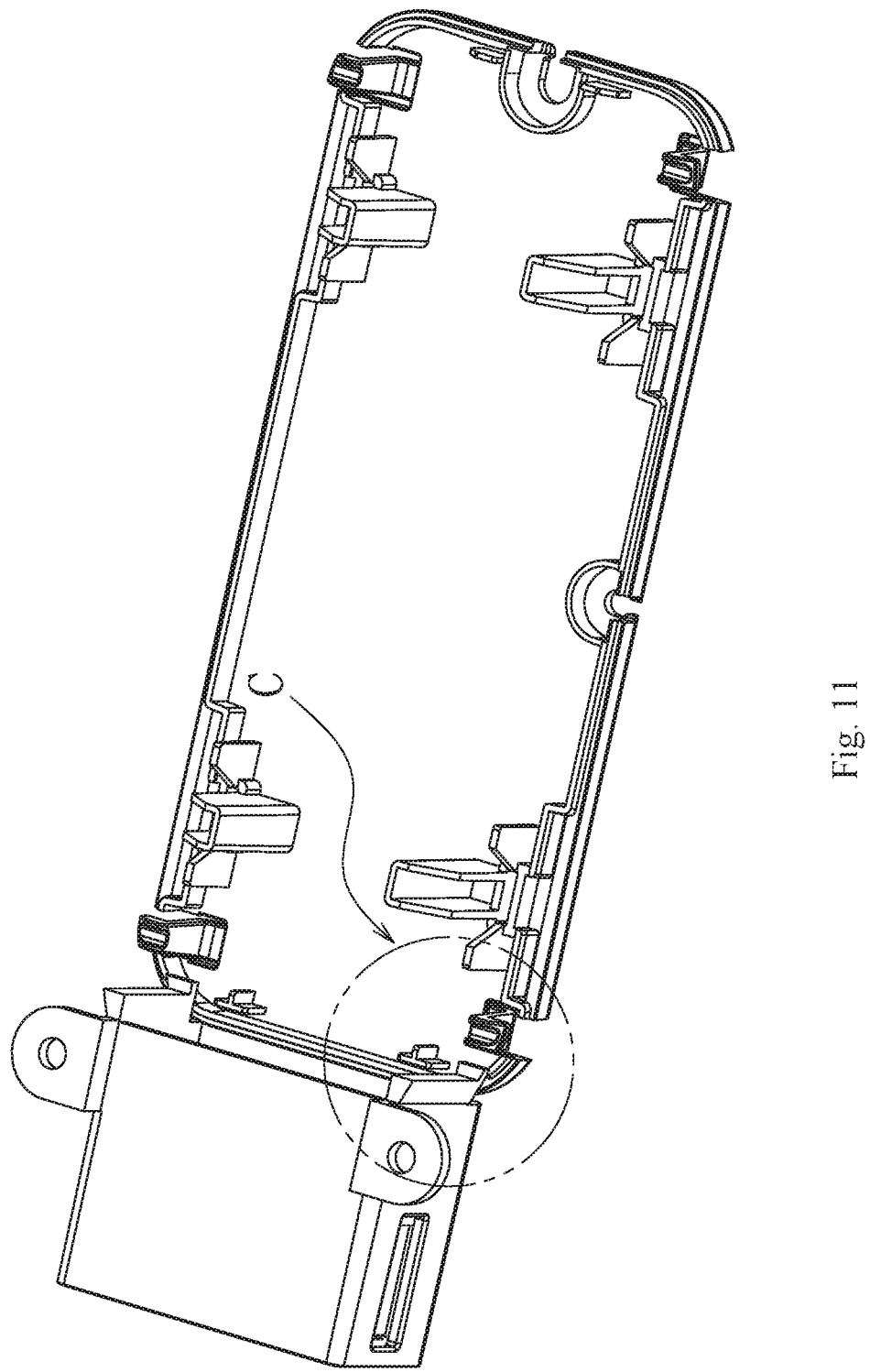
FIG. 11 is a partial structural view of the hand controller in FIG. 10.
Figure 12:
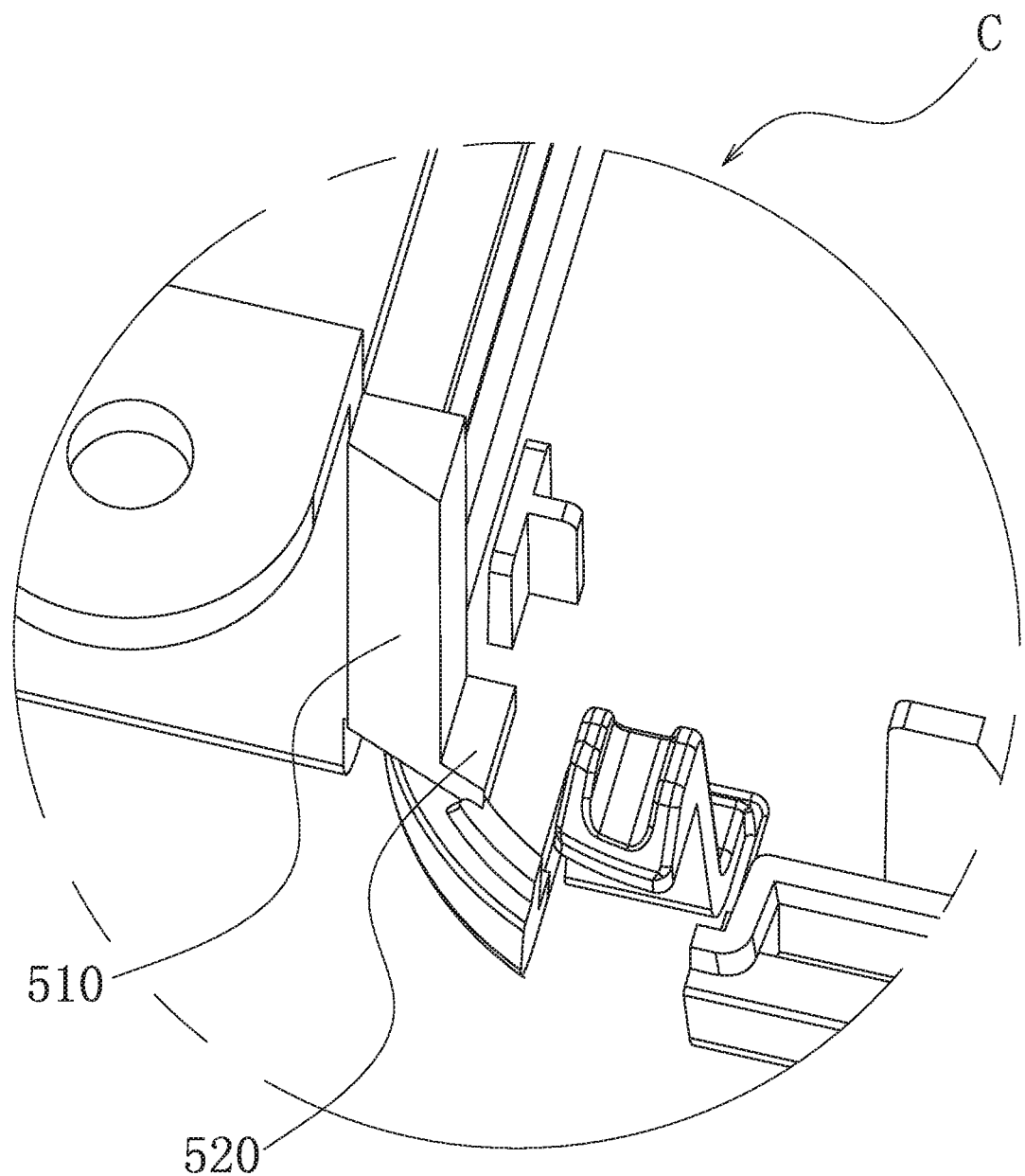
FIG. 12 is an enlargement of part C in FIG. 11.
Figure 13:
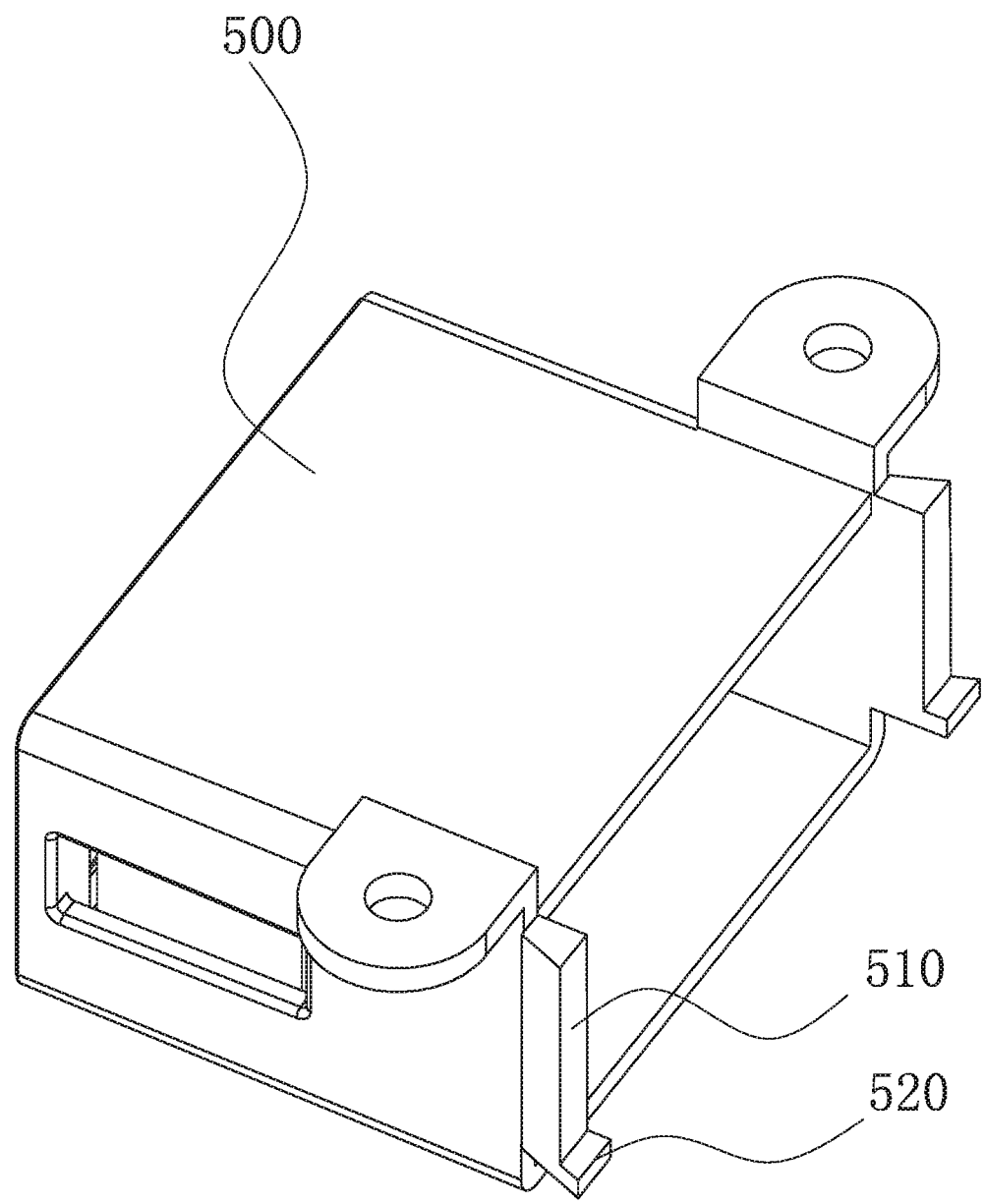
FIG. 13 is a structural view of a USB module in a preferable embodiment of the present invention.
Figure 14:
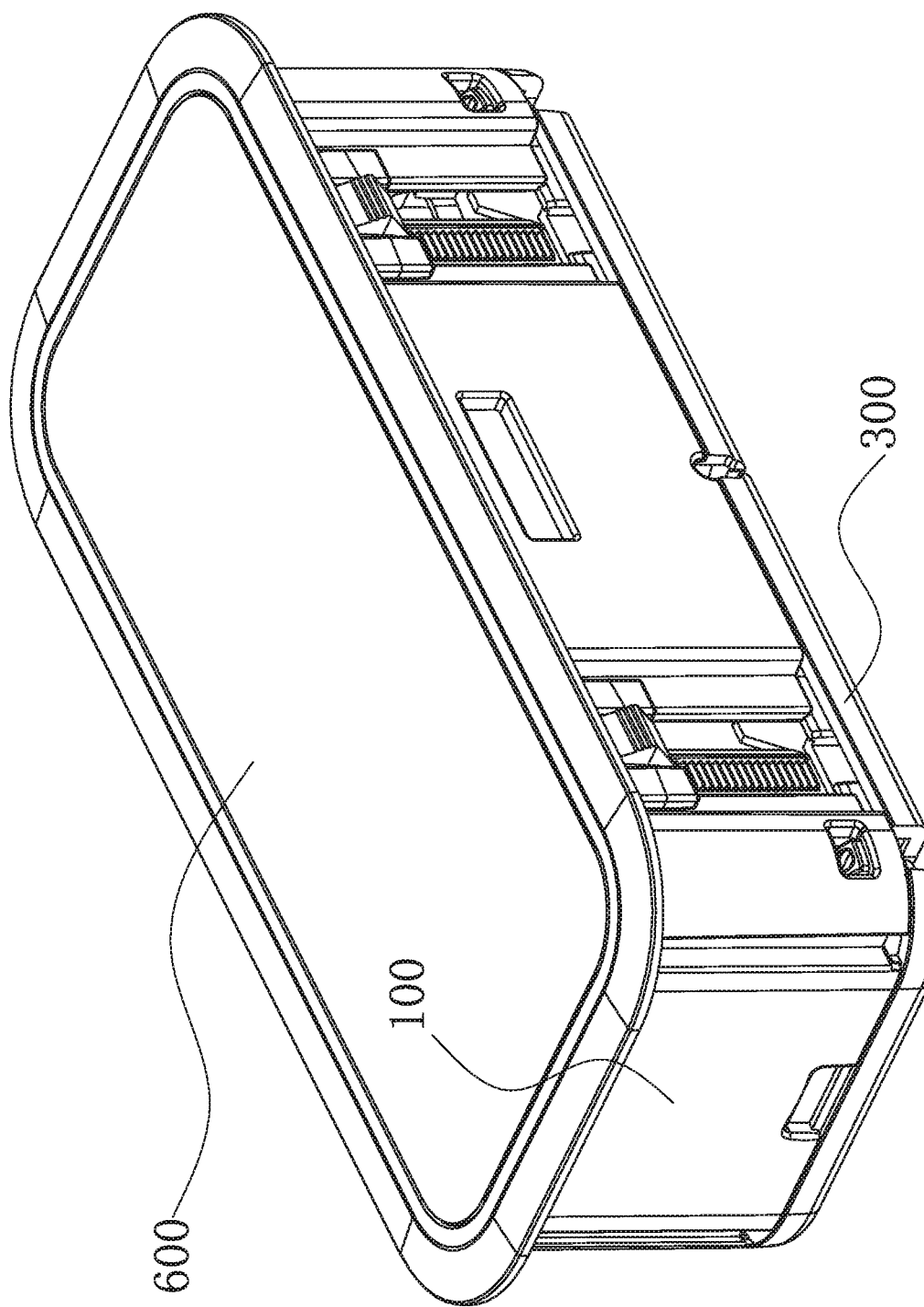
FIG. 14 is a structural view of a hand controller in the third embodiment of the present invention.
Figure 15:
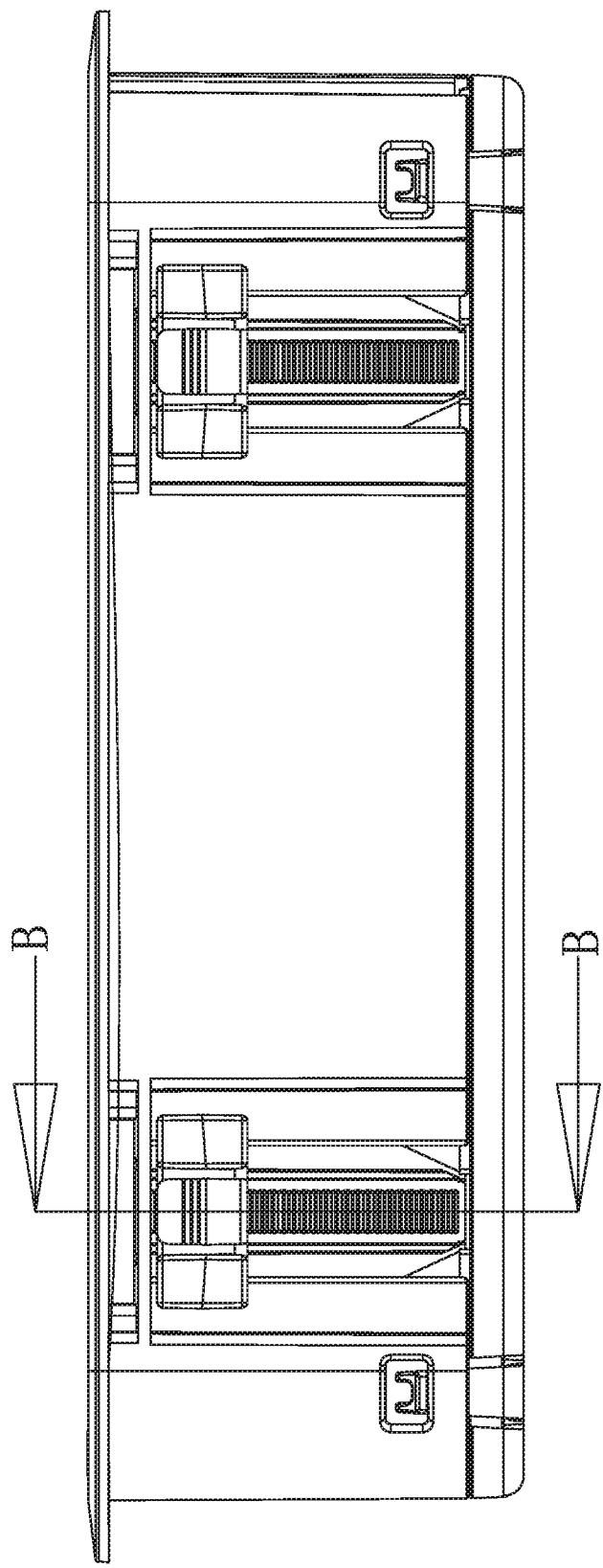
FIG. 15 is a structural view of the hand controller of the present invention as shown in FIG. 14 from another angle of view.
Figure 16:
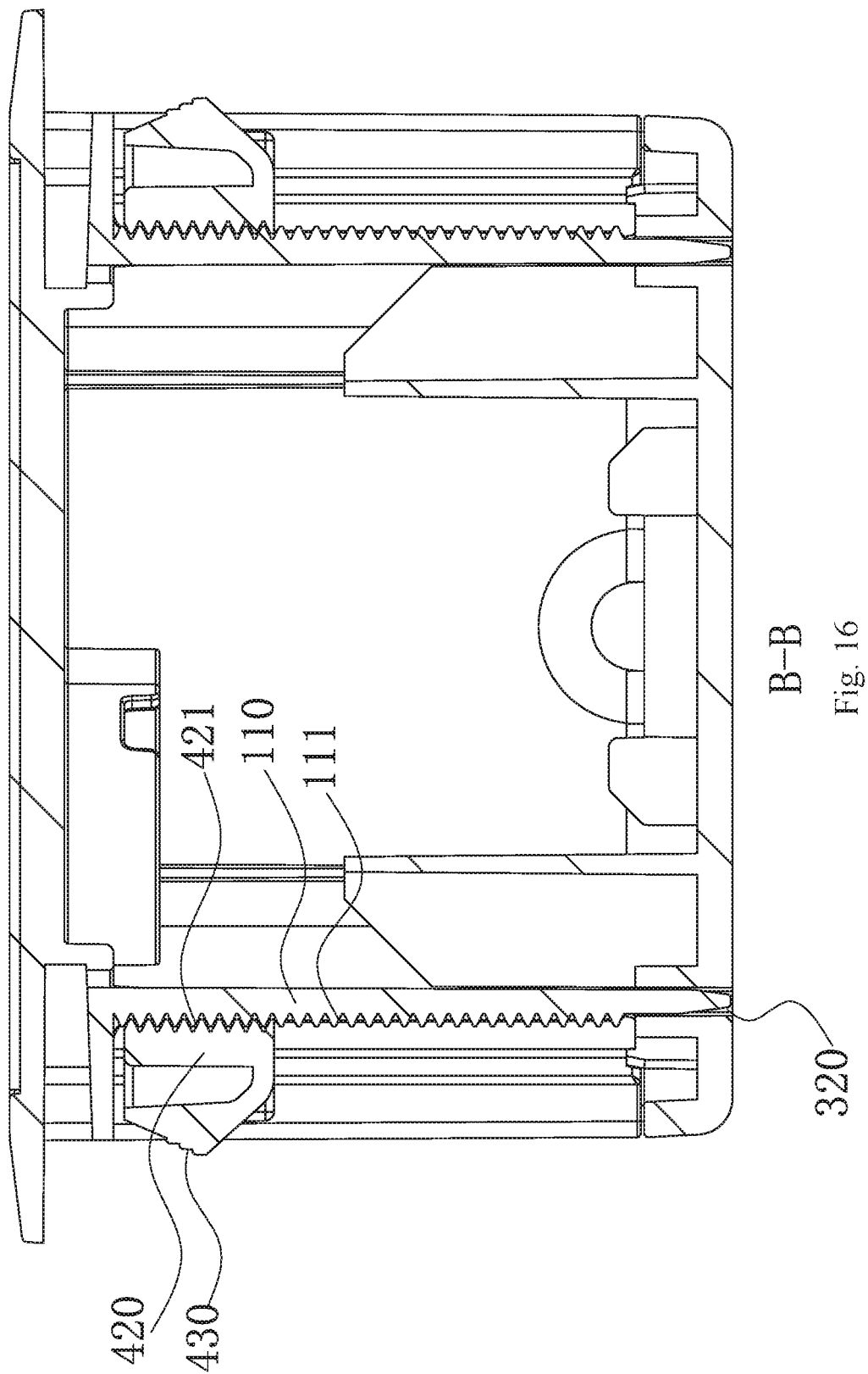
FIG. 16 is a sectional view of section B-B in FIG. 15.
Figure 19:
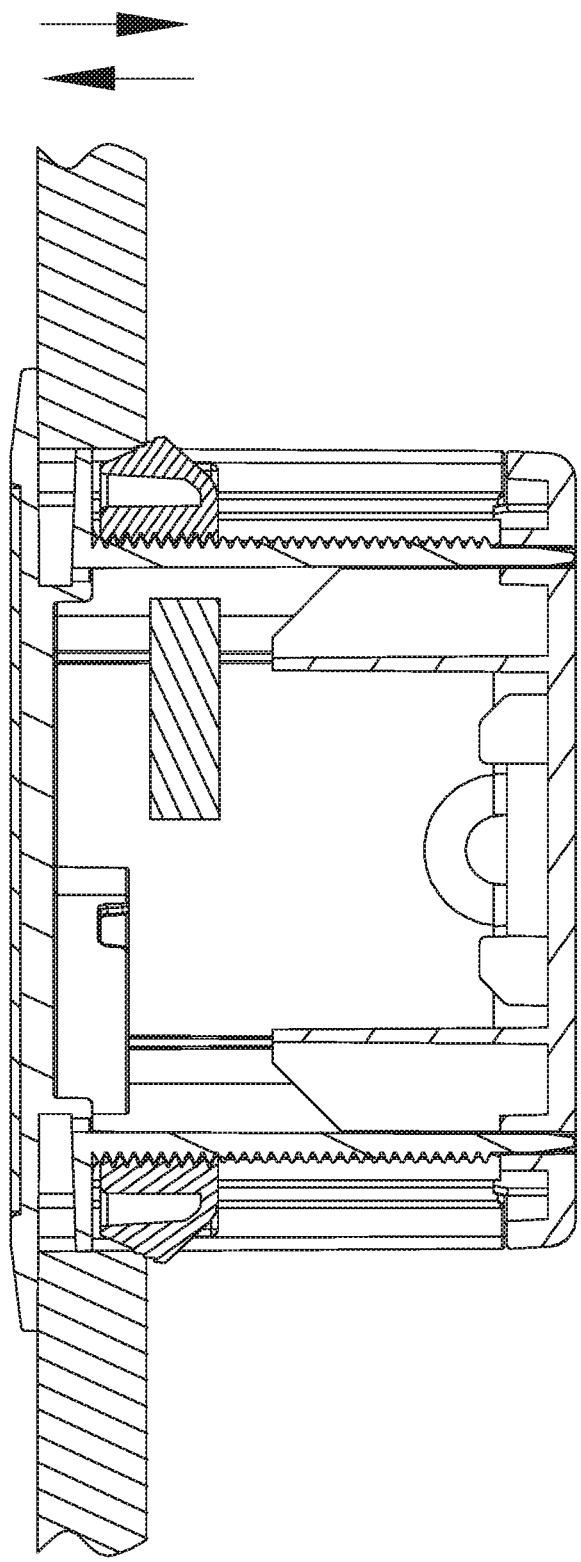
FIG. 19 is a sectional view of the hand controller in use in FIG. 13.
Figure 20:
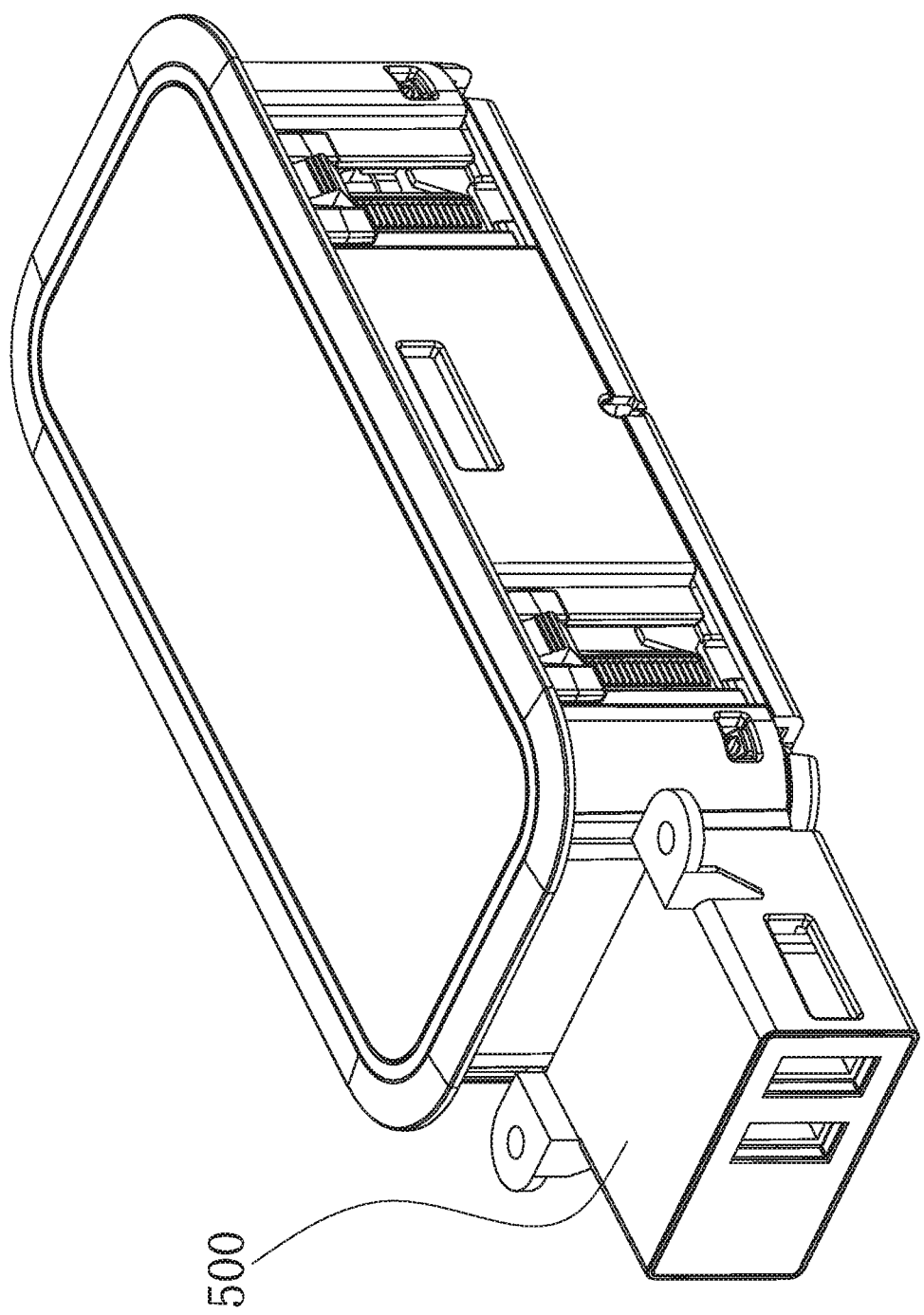
FIG. 20 is a structural view of a hand controller in the fourth embodiment of the present invention.

When the position of the limiting part 110 can be determined according to the overall shape of a control cabinet and when the control cabinet is of a round structure, the limiting part 110 and the connection part 420 can both be annularly arranged according to the control cabinet; and when the control cabinet is of a rectangular structure, the limiting part 110 and the connection part 420 can both be arranged in a rectangular way, as shown in FIG. 4.

In this embodiment, the arrangement of four limiting parts 110 and four corresponding connection part 420 can realize adjustment on all corners of the hand controller, and ensure stability when the hand controller is installed on the tabletop and reliability of signal transmission when a user presses the keys 200.

Preferably, as shown in FIG. 1-9, a first guide portion is arranged between each connection part 420 and the housing 100, wherein the first guide portion is adapted to male-female fit connection.

In this embodiment, the first guide portion which guides the connection part 420 to move up and down along the limiting part 110 is arranged, such that the user can smoothly and conveniently adjust the height of the connection part 420.

Further preferably, the first guide portion includes a guide wall 120 which is arranged on one or two sides of the limiting part 110, and a guide slot 422 which is arranged on corresponding one or two sides of the connection part 420.

Preferably, as shown in FIG. 1-9, a second guide portion is arranged between each limiting part 110 and the cover plate 300, wherein the second guide portion and the limiting part 110 are mutually matched and connected to form a bevel-guided movable structure. In this embodiment, the limiting part 110 has a certain length, and there is a clearance between each of the two side walls of the limiting part 110 and the housing 100, so the limiting part 110 is naturally vertical or slightly recessed (inclined toward the inner side of the housing 100) under the condition that the housing 100 and the cover plate 300 are not assembled, which affects locking between the limiting part 110 and the connection part 420. Therefore, the arrangement of the second guide portion allows an outward projecting force applied to the recessed limiting part 110 by the guide characteristic of the bevel to adjust the inclined limiting part 110 to the vertical state so as to realize locking between the limiting part 110 and the connection part 420, such that the connection part 420 is always located at the constant horizontal position.

Further preferably, the second guide portion includes a pusher 310 arranged on the cover plate 300; the bevel-guided movable structure includes a first guide bevel 311; the first guide bevel 311 is arranged on one side of the pusher 310 or the limiting part 310, wherein the pusher 310 is also provided with a vertical plane 312.

In this embodiment, under the condition that the housing 100 is connected with the cover plate 300, the first guide bevel 311 can provide a guide force to the limiting part 110 after the pusher 310 touches the top and bottom of the limiting part 110 to slowly move the limiting part 110 in a translation way towards the connection part 420 so as to realize locking between the limiting part 110 and the connection part 420, such that the connection part 420 is always located at a constant horizontal position. The pusher 310 is also provided with a vertical plane 312 to avoid breakage due to translational movement of the limiting part 110 so as to ensure reliable locking between the limiting part 110 and the connection part 420; in addition, the vertical plane 312 can be used as the stopper between the second guide portion and the limiting part 110 to avoid the limiting part 110 from rebounding after the housing 100 is connected with the cover plate 300, thus ensuring reliable locking between the limiting part 110 and the connection part 420.

Further preferably, the second guide portion is a push hole 320, and the push hole 320 is formed on the cover plate 300.

In this embodiment, the role of the push hole 320 is the same as that of the pusher 310. The push hole also controls the translational movement of the limiting part 110 by using the guide characteristic of the first guide bevel 311 to ensure reliable locking between the limiting part 110 and the connection part 420.

The first guide bevel 311 in the embodiment can be arranged at any one of the pusher 310, the push hoe 320 and the limiting part 110.

Preferably, as shown in FIG. 1-9, a third guide portion is arranged between each limiting part 110 and the cover plate 300, wherein the third guide portion consists of two guide blocks 330 which are respectively located on two sides of the second guide portion, and the guide blocks 330 are mounted on the cover plate 300.

In this embodiment, the third guide part is used to adjust the left and right positions of the limiting part 100 and limit the degree of freedom of the limiting part in the horizontal direction, thus ensuring further reliable locking between the limiting part 110 and the connection part 420.

Further preferably, each of the guide blocks 330 is provided with a second guide bevel 331.

Preferably, as shown in FIG. 1-9, the connection part 420 is of a Z-shaped structure, wherein the second engagement portion and the connection portion are respectively arranged at two ends of the connection part 420, and the connection portion is a threaded hole 410 formed on the connection part 420.

Preferably, as shown in FIG. 1-9, a clamping groove 130 is arranged at each of the corners of the housing 100, and an elastic buckle 340 is arranged at each of corresponding corners of the cover plate 300.

Embodiment 2

As shown in FIG. 1-13, compared with Embodiment 1, Embodiment 2 is different in that the hand controller also includes a USB module 500 on the basis of Embodiment 1, and the USB module 500 is detachably connected to one side of the housing 100.

In this embodiment, the arrangement of the USB module 500 adds a function to the hand controller, and provides one more choice for users, making the product more humanized.

Preferably, as shown in FIG. 1-13, a fourth guide portion is arranged between the USB module 500 and the housing 100, wherein the fourth guide portion is adapted to male-female fit connection.

Further preferably, the fourth guide portion includes a sliding slot 140 which is arranged on the housing 100, and a sliding bar 510 which is arranged on USB module 500.

Further preferably, the fourth guide portion also includes a locating groove 350 which is arranged on the cover plate 300 and a locating block 520 which is arranged at an end of the sliding bar 510.

Further preferably, the locating groove 350 and the locating block 520 are both structured as dovetails or circular arcs.

In this embodiment, the locating groove 350 and the locating blocks 520 are structured as dovetails or circular arcs to limit the degree of freedom of the USB module 500 on the cover plate 300 and avoid the USB module 500 from moving horizontally, thus improving the electrification reliability of the USB module 500.

Embodiment 3

As shown in FIG. 14-19, compared with Embodiment 1, Embodiment 3 is different in that the hand controller in Embodiment 1 is installed on the exterior of the tabletop and the controller is connected with the tabletop via fasteners, while the hand controller in embodiment 3 is embedded on the tabletop, and the hand controller is in a leaning connection with the tabletop. The present invention provides a hand controller, including a housing 100, the housing provided with a control panel 600, wherein the housing 100 has an outside wall provided with a first engagement portion; a cover plate 300, being in a snap connection with the housing 100; and a connection assembly 400, the connection assembly provided with a second engagement portion which is in an engagement connection with the first engagement portion, wherein the engagement between the first engagement portion and the second engagement portion drive the connection assembly 400 to move up and down along the thickness direction of the housing 100, and the connection assembly 400 is provided with a connection portion, wherein the connection portion is leaned against and clamped with the installation position of the hand controller.

Further preferably, the connection part is provided with a step-like bevel 430.

In this embodiment, the step-like bevel 430 realizes fixation between the hand controller and the tabletop, so the operation is more convenient and reliable; in addition, the step-like bevel 430 of the connection portion can further improve locking between the connection part 420 and the limiting part 110 to improve the operation reliability of the hand controller.

Further preferably, one end of the connection portion is connected with the connection part 420, while the other end of the connection portion keeps a clearance from the connection part 420, such that the connection portion becomes an elastic connection portion to facilitate connection and dismantling between the hand controller and the tabletop.

Further preferably, the connection part is also provided with a third guide bevel 440, and the third guide bevel 440 and the step-like bevel 430 form a horn distribution. The third guide bevel 440 and the step-like bevel 430 form an angle.

In this embodiment, the third guide bevel 440 facilitates the embedded installation of the hand controller in the tabletop, and the step-like bevel 430 realizes the reliable connection between the hand controller and the tabletop.

Embodiment 4

As shown in FIG. 14-20, compared with Embodiment 3, Embodiment 4 is different in that the hand controller also includes a USB module 500 on the basis of Embodiment 3, and the USB module 500 is detachably connected to one side of the housing 100. The structure and connection mode of the USB module 500 in Embodiment 4 are both identical with those of USB module 500 in Embodiment 2 and therefore are not described repeatedly.

The above embodiments are merely preferable embodiments of the present invention. It should be noted that, within the technical concept of the present invention, those ordinarily skilled in the art can make various improvements and modifications which shall all fall within the protective scope of the present invention.

What is claimed is:

1. A hand controller, characterized by comprising:
   a housing (100), the housing provided with a plurality of convex keys (200), wherein the housing (100) has an outside wall provided with a first engagement portion;
   a cover plate (300), being in a snap connection with the housing (100); and,
   a connection assembly (400), the connection assembly provided with a second engagement portion which is in an engagement connection with the first engagement portion, wherein the engagement between the first engagement portion and the second engagement portion drives the connection assembly (400) to move up and down along the thickness direction of the housing (100), and the connection assembly (400) is provided with a connection portion, wherein the connection portion is connected to the installation position of the hand controller via a fastener.

2. The hand controller according to claim 1, characterized in that the first engagement portion comprises at least one limiting part (110) arranged on the housing (100), wherein the limiting part (110) is provided with first teeth (111); the connection assembly (400) comprises at least one connection part (420), and the connection part is provided with the second engagement portion, wherein the second engagement portion comprises second teeth (421) which are engaged with the first teeth (111).

3. The hand controller according to claim 1, characterized in that a first guide portion for guiding the connection assembly (400) to move up and down along the thickness direction of the housing (100) is arranged between each connection part (420) and the housing (100), wherein the first guide portion is adapted to male-female fit connection.

4. The hand controller according to claim 3, characterized in that the first guide portion comprises a guide wall (120) which is arranged on one or two sides of the limiting part (110), and a guide slot (422) which is arranged on corresponding one or two sides of the connection part (420).

5. The hand controller according to claim 3, characterized in that a second guide portion is arranged between each limiting part (110) and the cover plate (300), wherein the second guide portion and the limiting part (110) are mutually matched and connected to form a bevel-guided movable structure.

6. The hand controller according to claim 5, characterized in that the second guide portion comprises a pusher (310) mounted on the cover plate (300) or a push hole (320) formed on the cover plate (300).

7. The hand controller according to claim 6, characterized in that the bevel-guided movable structure includes a first guide bevel (311), and the first guide bevel (311) is arranged on one side of the pusher (310), the push hole (320) or the limiting part (110).

8. The hand controller according to claim 5, characterized in that a third guide portion is arranged between each limiting part (110) and the cover plate (300), wherein the third guide portion consists of two guide blocks (330) which are respectively located on two sides of the second guide portion, and the guide blocks (330) are mounted on the cover plate (300).

9. The hand controller according to claim 8, characterized in that each of the guide blocks (330) is provided with a second guide bevel (331).

10. The hand controller according to claim 2, characterized in that the connection part (420) is a Z-shaped structure, wherein the second engagement portion and the connection portion are respectively arranged at two ends of the connection part (420), and the connection portion is a threaded hole (410) formed on the connection part (420).

11. The hand controller according to claim 1, characterized in that a clamping groove (130) is arranged at each of corners of the housing (100), and an elastic buckle (340) is arranged at each of corresponding corners of the cover plate (300).

12. A hand controller, characterized by comprising:
a housing (100), the housing provided with a control panel (600), wherein the housing (100) has an outside wall provided with a first engagement portion;
a cover plate (300), being in a snap connection with the housing (100);
a connection assembly (400), the connection assembling provided with a second engagement portion which is in an engagement connection with the first engagement portion, wherein the engagement between the first engagement portion and the second engagement portion drives the connection assembly (400) to move up and down along the thickness direction of the housing (100), and the connection assembly (400) is provided with a connection portion, wherein the connection portion is leaned against and clamped with the installation position of the hand controller.

13. The hand controller according to claim 12, characterized in that the connection portion is provided with a step-like bevel (430).

14. The hand controller according to claim 13, characterized in that the connection portion is also provided with a third guide bevel (440), wherein the step-like bevel (430) and the third guide bevel (440) form a horn distribution.

15. The hand controller according to claim 1, characterized by further comprising a USB module (500), detachably connected to one side of the housing (100).

16. A hand controller, characterized by comprising:
a housing (100), the housing provided with a control panel (600), wherein the housing (100) has an outside wall provided with a first engagement portion;
a cover plate (300), being in a snap connection with the housing (100); a connection assembly (400), the connection assembling provided with a second engagement portion which is in an engagement connection with the first engagement portion, wherein the engagement between the first engagement portion and the second engagement portion drives the connection assembly (400) to move up and down along the thickness direction of the housing (100), and the connection assembly (400) is provided with a connection portion, wherein the connection portion is leaned against and clamped with the installation position of the hand controller; and,
a USB module (500), detachably connected to one side of the housing (100).

17. The hand controller according to claim 15, characterized by comprising a fourth guide portion arranged between the USB module (500) and the housing (100), wherein the fourth guide portion is adapted to male-female fit connection.

18. The hand controller according to claim 17, characterized in that the fourth guide portion comprises a sliding slot (140) which is arranged on the housing (100), and a sliding bar (510) which is arranged on USB module (500).

19. The hand controller according to claim 18, characterized in that the fourth guide portion also comprises a locating groove (350) which is arranged on the cover plate (300) and a locating block (520) which is arranged at an end of the sliding bar (510).

20. The hand controller according to claim 19, characterized in that the locating groove (350) and the locating block (520) are both structured as dovetails or circular arcs.

* * * * *